United States Patent
Miyoshi et al.

(10) Patent No.: US 6,323,620 B1
(45) Date of Patent: Nov. 27, 2001

(54) ELECTRIC POWER SYSTEM USING AN ELECTRIC POWER STORING SECONDARY BATTERY EFFECTIVE FOR LOAD LEVELING

(75) Inventors: Tadahiko Miyoshi; Manabu Madokoro, both of Hitachi (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/649,959

(22) Filed: Aug. 29, 2000

(30) Foreign Application Priority Data

Mar. 14, 2000 (JP) .................................................. 12-076338

(51) Int. Cl.[7] .................................................. H01M 10/46
(52) U.S. Cl. .................................................. 320/118
(58) Field of Search .................................. 320/116, 118, 320/119, 132

(56) References Cited

U.S. PATENT DOCUMENTS

| | | |
|---|---|---|
| 4,582,669 * | 4/1986 | Watts et al. . |
| 4,732,823 * | 3/1988 | Ito et al. . |
| 5,481,140 * | 1/1996 | Maruyama et al. . |
| 5,483,144 * | 1/1996 | Marek . |
| 5,675,970 * | 10/1997 | Yamada et al. . |
| 5,726,551 * | 3/1998 | Miyazaki et al. . |
| 5,758,331 * | 5/1998 | Johnson . |
| 5,767,660 * | 6/1998 | Schmidt . |
| 5,847,542 * | 12/1998 | Ichihara . |

FOREIGN PATENT DOCUMENTS

| | | |
|---|---|---|
| 8-28795 | 2/1996 | (JP) . |
| 8-138731 | 5/1996 | (JP) . |
| 11-233137 | 8/1999 | (JP) . |

* cited by examiner

Primary Examiner—Edward H. Tso
(74) Attorney, Agent, or Firm—Mattingly, Stanger & Malur, P.C.

(57) ABSTRACT

An electric power system effective for load leveling includes an electric power meter which measures the power that is charged from a generating facility into an electric power storing secondary battery via ac/dc converters, and also measures the discharged power that is supplied from the electric power storing secondary battery to a load via the ac/dc converters. A processing unit is provided which calculates a difference of an electric power fee from the quantity of charged power and quantity of discharged power measured by the electric power meter and respective unit prices of electric power, and then calculates the price for using the electric power storing secondary battery based on the electric power fee. The processing unit may be installed either on a manufacturer/lender's side or on an electric power consumer's side.

17 Claims, 3 Drawing Sheets

ELECTRIC POWER SYSTEM USING AN ELECTRIC POWER STORING SECONDARY BATTERY EFFECTIVE FOR LOAD LEVELING

BACKGROUND OF THE INVENTION

The present invention relates to a use system and application of an electric power storing secondary battery that is effective for load leveling.

A load leveling system which stores electric power in the nighttime and uses it in the daytime employing an electric power storing secondary battery, as disclosed in Japanese Application Patent Laid-Open Publication Nos. Hei 8-287958 (1996), Hei 8-138731 (1996), and Hei 11-233137 (1999), is expected to be used widely in future because the system is very much effective for diminishing the necessity for constructing a generating facility and transmission/transformation equipment corresponding to the peak power in the daytime and for improving the utilization factor of the generating facility and transmission/transformation equipment.

An electric power storing secondary battery could be located in a substation in the suburb of a city but more locations are needed for expanded utilization. Besides, since the locations are desired to be closer to the electric power consumers for minimizing transmission equipment, it is preferred that the electric power storing secondary battery be installed near at hand an electric power consumer. If, however, the electric power consumer is to own the electric power storing secondary battery and utilize it in a building, apartment house, or solitary island, the electric power consumer must have knowledge and capability of operating, maintaining and managing the electric power storing secondary battery. This has been an obstacle to the popularization of the electric power storing secondary battery. This problem is particularly serious if a sodium-sulfur battery or the like that contains hazardous material is used as the electric power storing secondary battery, that is, a qualified hazardous material operator is required for the operation because of the regulation of the Fire Fighting Law. This has made it difficult for a power user to operate, maintain and manage the electric power storing secondary battery.

If an electric power consumer is to employ an electric power storing secondary battery, it is important for the popularization that the purchase cost of the electric power storing secondary battery can be covered with the difference between the daytime power fee and the nighttime power fee. In case an electric power consumer is to purchase an electric power storing secondary battery, however, the electric power consumer has to make an initial investment in the equipment and, although it could be recovered after years of continued utilization, this has been an obstacle to the popularization.

There is another problem. If the electric power storing secondary battery is to be installed at a place like a building, apartment house, or solitary island, where multiple electric power consumers are resident, more batteries and wider space are required so that each electric power consumer is equipped with individual electric power storing secondary battery.

SUMMARY OF THE INVENTION

The objective of the present invention is to provide a use system and application of an electric power storing secondary battery which eliminates the aforementioned deficiencies in the prior art, is effective for the popularization of the electric power storing secondary battery, and is capable of producing a load leveling effect.

The first use system of an electric power storing secondary battery of the present invention is characterized in that the use system of an electric power storing secondary battery, in which electric power is stored in the nighttime and used in the daytime via an ac/dc converter, comprises an electric power meter which measures the charged power that is charged from a generating facility into the electric power storing secondary battery via the ac/dc converter, and also measures the discharged power that is supplied from the electric power storing secondary battery to a load via the ac/dc converter; and a processing unit which calculates a difference of electric power fee from the quantity of charged power and quantity of discharged power measured by the electric power meter and respective unit prices of electric power, and then calculates the price for using the electric power storing secondary battery based on the difference of the electric power fee or on the difference of the electric power fee and the difference between the minimum power fees before and after the employment of the electric power storing secondary battery.

The second use system of an electric power storing secondary battery of the present invention is characterized in it that the use system of an electric power storing secondary battery, in which electric power is stored in the nighttime and used in the daytime via an ac/dc converter, comprises an electric power meter which measures the charged power that is charged from a generating facility into the electric power storing secondary battery via the ac/dc converter, and also measures the discharged power that is supplied from the electric power storing secondary battery to a load via the ac/dc converter; and a processing unit which calculates the price for using the electric power storing secondary battery based on the balance calculated from the quantity of charged power and quantity of discharged power measured by the electric power meter and respective unit prices of electric power or based o the quantity of charged power and quantity of discharged power, the balance, and the difference between the minimum power fees before and after the employment of the electric power storing secondary battery.

The first application of an electric power storing secondary battery of the present invention is characterized in that, in the application of an electric power storing secondary battery, in which electric power is stored in the nighttime and used in the daytime via an ac/dc converter, the charged power that is charged from a generating facility into the electric power storing secondary battery via the ac/dc converter is measured; the discharged power that is supplied from the electric power storing secondary battery to a load is measured; a difference of electric power fee is calculated from the measured quantity of charged power and quantity of discharged power and respective unit prices of electric power;

and the price for using the electric power storing secondary battery is calculated based on the difference of the electric power fee or on the difference between the minimum power fees before and after the employment of the electric power storing secondary battery.

The second application of a power storage battery of the present invention is characterized in that, in the application of an electric power storing secondary battery, in which electric power is stored in the nighttime and used in the daytime via an ac/dc converter, the charged power that is charged from a generating facility into the electric power storing secondary battery via the ac/dc converter is measured, the discharged power that is supplied from the electric power storing secondary battery to a load is measured; and the price for using the electric power storing secondary battery is calculated based on the balance calculated from the measured quantity of charged power and quantity of discharged power and respective unit prices of electric power or based on the quantity of charged power and quantity of discharged power, the balance, and the difference between the minimum power fees before and after the employment of the electric power storing secondary battery.

According to the present invention, the price for using the electric power storing secondary battery can be calculated including the price for using the ac/dc converter. In addition, in the application of an electric power storing secondary battery, it is preferred that discharged power is supplied from a single power storage unit to multiple loads, and the discharged power fee to each load is calculated, that discharged power is supplied to multiple loads via a single ac/dc converter that is provided for the electric power storing secondary battery, and the discharged power fee to each load is calculated, or that multiple ac/dc converters that are provided for a single power storage unit are controlled by a single control unit, and the discharged power via each ac/dc converter is measured by a single electric power meter. Besides, it is particularly preferred that discharged power is supplied from a single electric power storing secondary battery to loads at multiple electric power consumers, and the discharged power fee to each electric power consumer is calculated, or that discharged power is supplied to loads at multiple electric power consumers via a single ac/dc converter that is provided for the electric power storing secondary battery, and the discharged power fee to each electric power consumer is calculated.

The third application of a power storage battery of the present invention is characterized in that, in the application of an electric power storing secondary battery, in which electric power is stored in the nighttime and used in the daytime via an ac/dc converter, discharged power is supplied to loads at multiple electric power consumers via an ac/dc converter that is provided for a single electric power storing secondary battery. According to the present invention, it is possible that a single ac/dc converter is provided for the electric power storing secondary battery, or that multiple ac/dc converters are provided for the electric power storing secondary battery. Besides, it is particularly preferred that the discharged power that is supplied to loads at the multiple electric power consumers is measured, and then each electric power consumer's use price share of the electric power storing secondary battery and/or ac/dc converter is calculated based on the quantity of discharged power to each electric power consumer, or based on the discharged power fee calculated from the quantity of discharged power and unit price of electric power, or based on the discharged power fee and the difference between the minimum power fees before and after the employment of the electric power storing secondary battery.

In addition, the aforementioned method is characterized in that demand transaction to users of the electric power storing secondary battery is processed based on the calculated price for using the electric power storing secondary battery.

PREFERRED EMBODIMENT OF THE INVENTION

Figure 1:
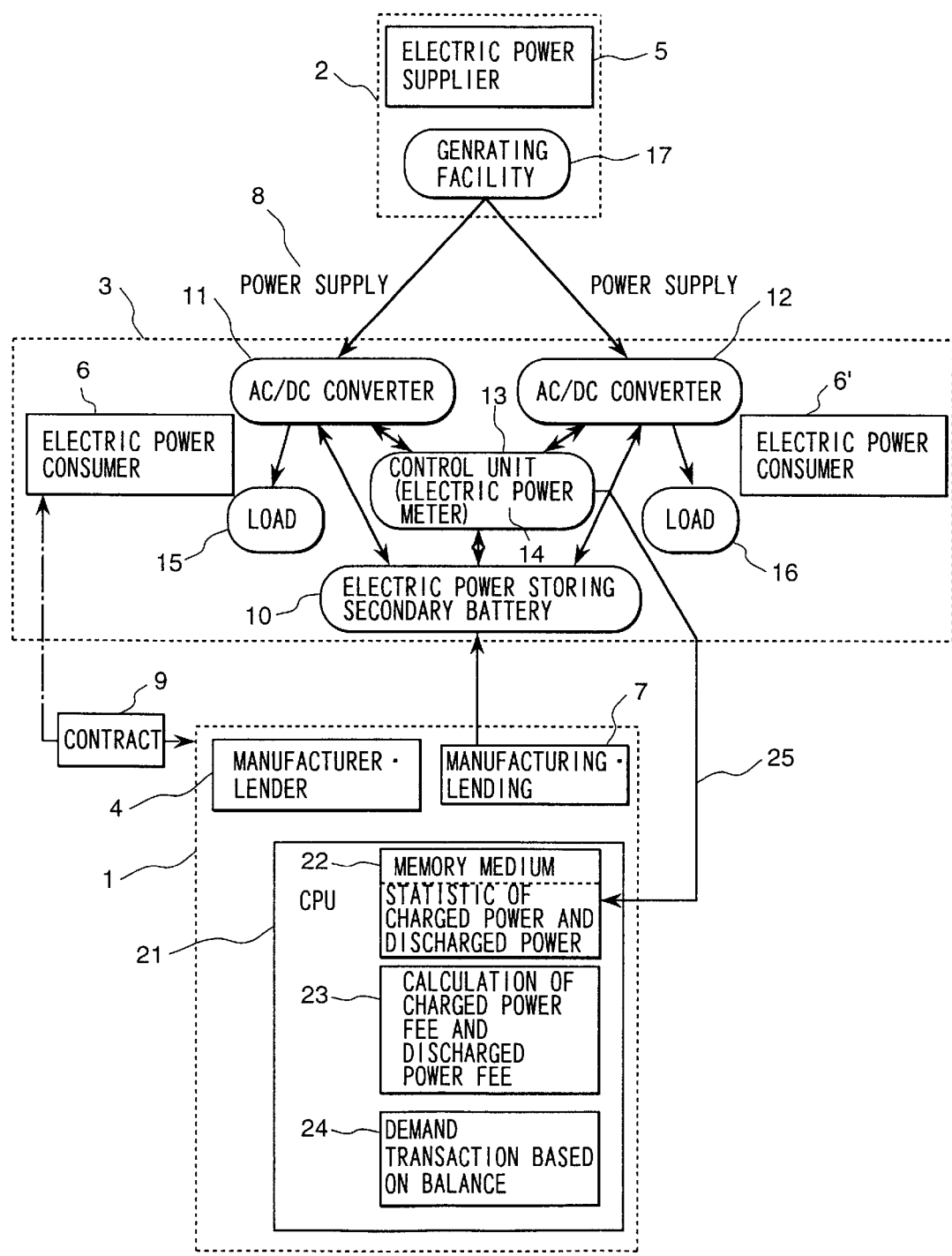
FIG. 1 is Diagram showing an embodiment of the electric power storing secondary battery of the present invention.

A preferred embodiment of the present invention is explained herein with reference to the accompanying drawings. FIG. 1 shows an embodiment of a use system and application of an electric power storing secondary battery of the present invention.

In the figure, a manufacturer/lender 4, an electric power supplier 5, and an electric power consumer 6 are concerned with the application mode of an electric power storing secondary battery, and each is included in a manufacturing/lending system 1, a power supply system 2, and a power consumption system 3, respectively as shown by a dotted line in the figure.

The manufacturer/lender 4 manufactures an electric power storing secondary battery 10 and lend it to the electric power consumer 6 according to a contract entered. Type of lending includes direct lending to the user or lending via a financing company. The electric power storing secondary battery 10 is equipped with ac/dc converters 11 & 12 and a control unit 13 for ac/dc conversion by the ac/dc converters 11 & 12. The control unit 13 is equipped with an electric power meter 14. All these apparatuses and devices are supplied by the manufacturer/lender 4.

The electric power supplier, who owns a generating facility 17 in its power supply system 2, supplies power to the electric power storing secondary battery 10 installed in the power consumption system 3 via the ac/dc converters 11 & 12 particularly in the nighttime. The supplied power is stored in the electric power storing secondary battery 10 as charged power. The electric power used for charging is measured by the electric power meter 14 and recorded, after statistic, in a memory medium (not shown).

The manufacturer/lender 4 is equipped with a central processing unit (CPU) 21 in its manufacturing/lending system 1. It is allowable that the electric power consumer 6 is equipped with the CPU 21. In either case, the other party is informed of the data of the consumed electric power.

The power stored in the electric power storing secondary battery 10 is supplied and discharged to loads 15 & 16 via the ac/dc converters 11 & 12 particularly in the daytime, and consumed. If the loads 15 & 16 are apparatuses for direct current, the electric power is supplied directly to them, and not via the ac/dc converters 11 & 12.

Discharged power is measured by the electric power meter 14 and recorded, after statistic, on a memory medium.

The quantity of charged power and quantity of discharged power measured by the electric power meter 14 are sent to the CPU 21 via a communication line 25, the quantity of charged power and quantity of discharged power are recorded as statistic on the memory medium 22, the charged power fee and the discharged power fee are calculated 23 by the CPU 21, and demand transaction to users is done based on the balance.

It is possible that a single electric power storing secondary battery 10 is used by multiple electric power consumers 6 & 6' independently for their loads 15 & 16. In this application, the ac/dc converters 11 & 12 are installed for the loads 15 and 16, respectively, ac/dc conversion via the respective ac/dc converters 11 & 12 is controlled by a single control unit 13, and the quantity of charged power and quantity of discharged power are measured by a single electric power meter 14. It is allowable that each ac/dc converter 11 & 12 is equipped with an electric power meter. The electric power storing secondary battery 10 may be lent whole or in part, which depends upon the contract 9 between the manufacturer/lender 4 and the electric power consumer 6, and the price for using the electric power storing secondary battery is calculated by the CPU 21 according to the contents of the contract.

According to the aforementioned constructions of the present invention, there is provided a use system of an electric power storing secondary battery comprising of the electric power meter 14 which measures the charged power that is charged from the generating facility 17 into the electric power storing secondary battery 10 via the ac/dc converters 11 & 12, and also measures the discharged power that is supplied from the electric power storing secondary battery 10 to a load via the ac/dc converters 11 & 12; and the processing unit 21 which calculates a difference of electric power fee from the quantity of charged power and quantity of discharged power measured by the electric power meter 14 and respective unit prices of electric power, and then calculates the price for using the electric power storing secondary battery based on the difference of the electric power fee.

Besides, there is provided a use system of an electric power storing secondary battery comprising of the electric power meter 14 which measures the charged power that is charged from the generating facility 17 into the electric power storing secondary battery 10 via the ac/dc converters 11 & 12, and also measures the discharged power that is supplied from the electric power storing secondary battery to a load via the ac/dc converters; and the processing unit 21 which calculates the price for using the electric power storing secondary battery based on the balance calculated from the quantity of charged power and quantity of discharged power measured by the electric power meter 14 and respective unit prices of electric power.

Because the electric power fee is a sum of the electric power fee that is determined by the electric power quantity supplied from a generating facility multiplied by a unit price of electric power and the minimum power fee that is determined by a required peak power, the advantage for an electric power consumer in employing an electric power storing secondary battery may include not only the difference of electric power fee calculated from the quantity of charged power and quantity of discharged power but also the difference between the minimum power fees before and after the employment of the electric power storing secondary battery. In this case, a processing unit that calculates the price for using the electric power storing secondary battery based on the difference of the electric power fee and the difference of the minimum power fee is used, not shown though. The use price, including a special discount rate or fuel surcharge specified by the electric power supplier, can be calculated also by the processing unit.

Generally, by utilizing the discharged power from the electric power storing secondary battery, the required peak power to be supplied from a generating facility in the daytime decreases and consequently the electric power consumer can enjoy a merit of reduction in the minimum power fee.

Figure 2:
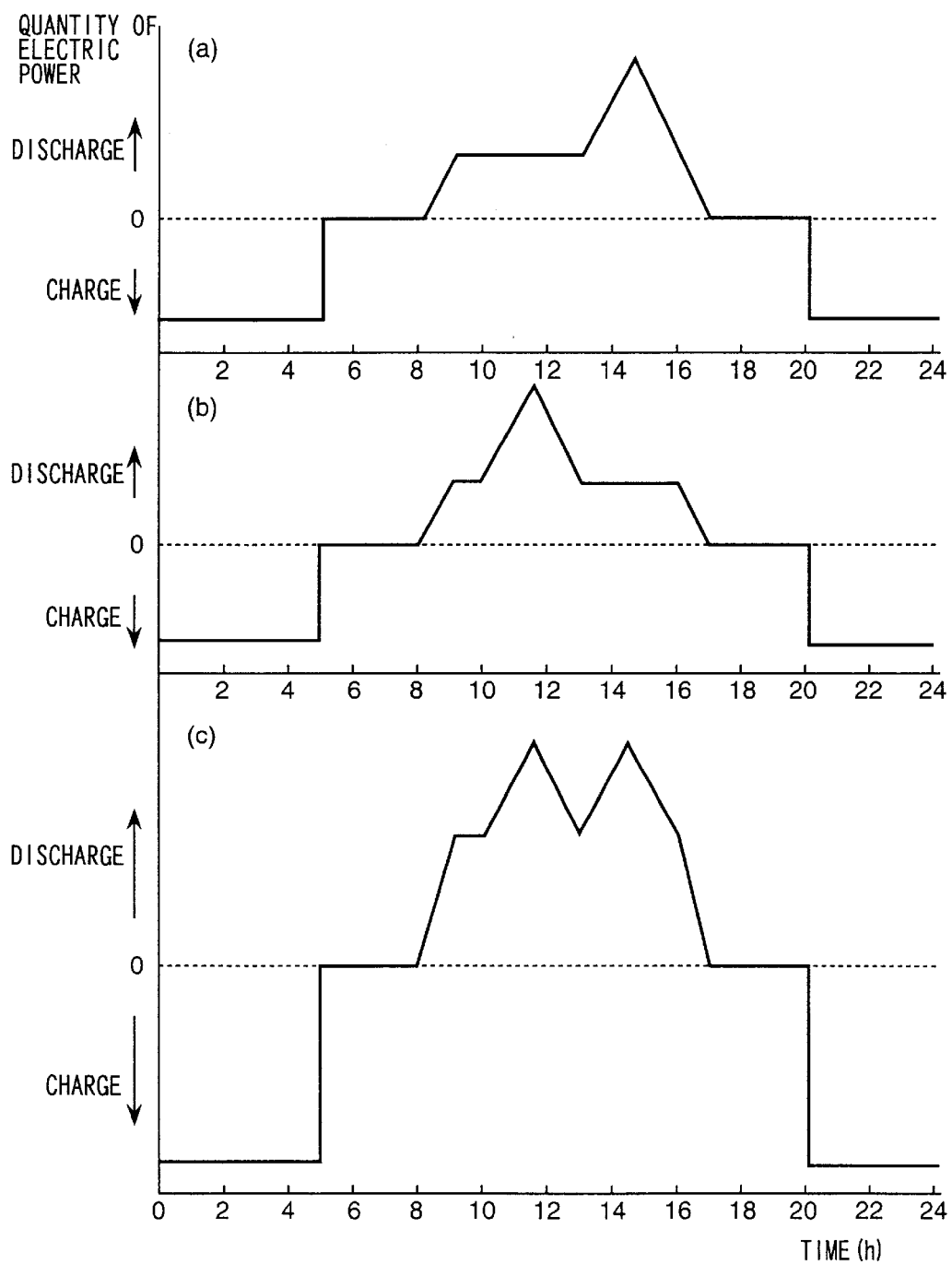
FIG. 2 is Diagram showing the operating state of the electric power storing secondary battery shown in FIG. 1.
Figure 3:
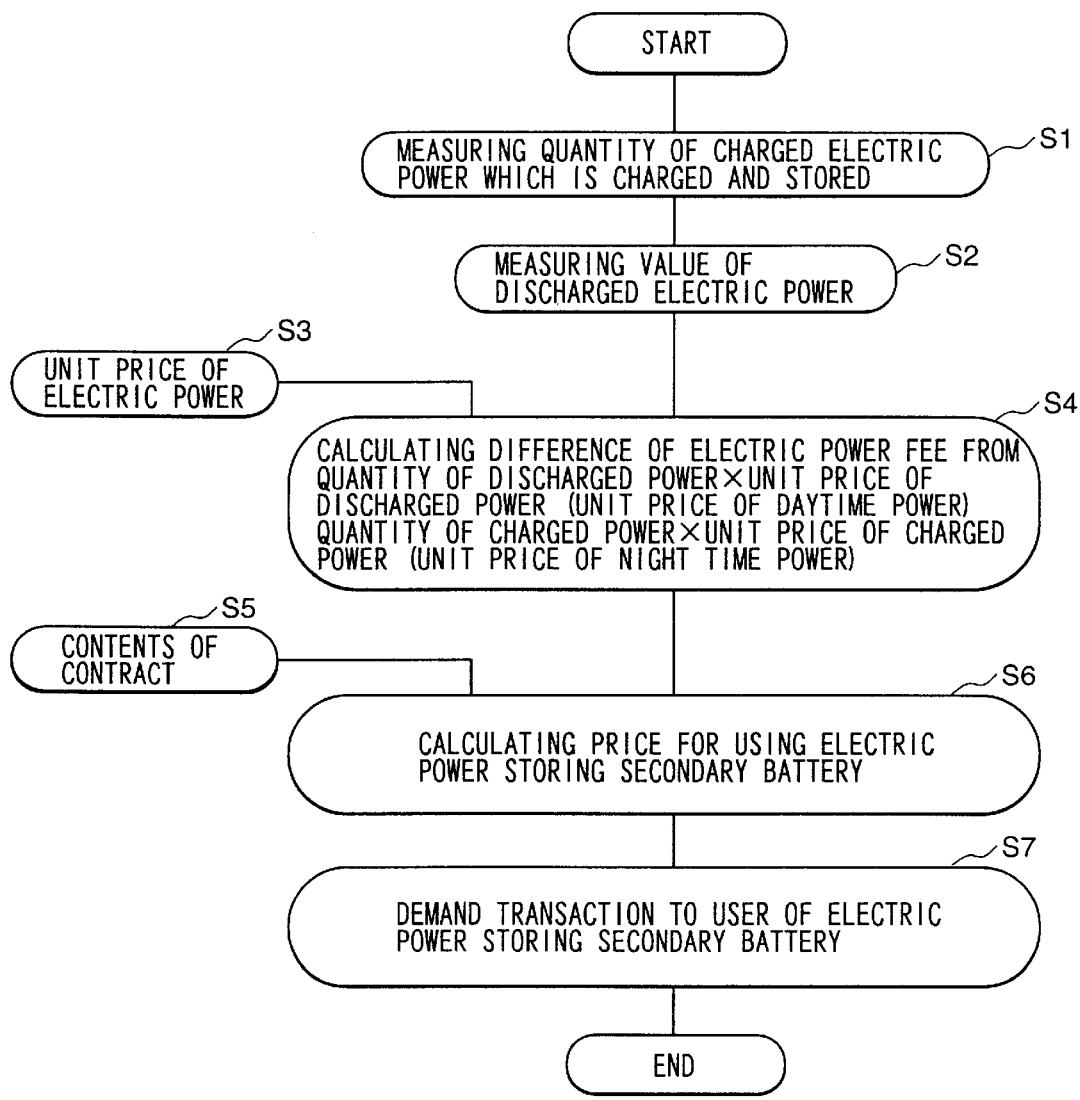
FIG. 3 is Flowchart.

FIG. 3 shows a step-by-step flow of an application of an electric power storing secondary battery. The charged and stored electric power quantity is measured (S1) and the quantity of discharged power is also measured (S2) in a manner as aforementioned. Charging and discharging of electric power are as shown in FIG. 2, which will be explained later.

The unit price of the electric power supplied by the electric power supplier 5 is preset, and this unit price of electric power is used (S3), and the difference of electric power fee is calculated from the quantity of discharged power×unit price of discharged power (unit price of daytime power) and the quantity of charged power×unit price of charged power (unit price of nighttime power) (S4).

According to the contents of the contract (S5), the price for using the electric power storing secondary battery is calculated (S6). The price for using the electric power storing secondary battery can be calculated including the price for using the ac/dc converters 11 & 12.

The above also applies to other apparatuses and devices.

In addition to the calculation of the difference of electric power fee, it is also possible, although not shown, that the difference between the minimum power fees before and after the employment of the electric power storing secondary battery is calculated in S4 and that the price for using the electric power storing secondary battery is calculated based on the calculated difference of electric power fee and the above difference of the minimum power fee in S6. Besides, the above use price can also be calculated including a special discount rate or fuel surcharge specified by the electric power supplier.

When the manufacturer/lender 4 takes charges of the operation and maintenance of the electric power storing secondary battery 10, cost for these services can be included in the price for using the electric power storing secondary battery under the contract 9. It is allowable that the electric power consumer 6 operates and maintains the electric power storing secondary battery 10 and others within its own capability. The use price decreases but this will be less advantageous because greater efforts are needed.

As a result, according to the steps above, there is provided an application of the electric power storing secondary battery 10, in which electric power is stored in the nighttime and used in the daytime via the ac/dc converters 11 & 12, wherein the charged power that is charged and stored from the generating facility 17 into the electric power storing secondary battery 10 via the ac/dc converters 11 & 12 is measured; the discharged power that is supplied from the electric power storing secondary battery to a load is measured; a difference of electric power fee is calculated from the measured quantity of charged power and quantity of discharged power and respective unit prices of electric power; and the price for using the electric power storing secondary battery is calculated based on the difference of the electric power fee or on the difference of the electric power fee and the difference between the minimum power fees before and after the employment of the electric power storing secondary battery. The above use price can be calculated including a special discount rate or fuel surcharge specified by the electric power supplier.

Besides, there is provided an application of the electric power storing secondary battery, in which electric power is stored in the nighttime and used in the daytime via an ac/dc converter, wherein, the charged power that is charged and stored from the generating facility into the electric power storing secondary battery via the ac/dc converter is measured;

the discharged power that is supplied from the electric power storing secondary battery to a load is measured; and the price for using the electric power storing secondary battery is calculated based on the balance calculated from the measured quantity of charged power and quantity of discharged power and respective unit prices of electric power or based on the balance, and the difference between the minimum power fees before and after the employment of the electric power storing secondary battery. The above use price can be calculated including a special discount rate or fuel surcharge specified by the electric power supplier.

Besides, there is provided an application of the electric power storing secondary battery, wherein the price for using the electric power storing secondary battery is calculated including the price for using the ac/dc converter.

Besides, there is provided an application of an electric power storing secondary battery, wherein discharged power is supplied from a single electric power storing secondary battery to multiple loads, and the discharged power fee to each load is calculated.

Besides, there is provided an application of an electric power storing secondary battery, wherein discharged power is supplied to multiple loads via a single ac/dc converter that is provided for the electric power storing secondary battery, and the discharged power fee to each load is calculated.

Besides, there is provided an application of an electric power storing secondary battery, wherein multiple ac/dc converters that are provided for a single electric power storing secondary battery are controlled by a single control unit, and the quantity of discharged power via each ac/dc converter is measured by a single electric power meter.

Besides, because the price for using the electric power storing secondary battery is paid separately by each electric power consumer, it is preferred that the discharged power fee to each electric power consumer is calculated in S4 or S6 and that each electric power consumer's price for using the electric power storing secondary battery is calculated based on the electric power fee. In this way, there is provided an application of an electric power storing secondary battery, wherein discharged power is supplied from a single electric power storing secondary battery to loads at multiple electric power consumers, and the discharged power fee to each electric power consumer is calculated.

The electric power storing secondary battery of the invention is an aggregate of cells or an aggregate of modules made of aggregated cells. In addition, application of a single electric power storing secondary battery to multiple loads means that multiple ac/dc converters are installed on a common aggregate of cells or modules or that multiple electric power consumers use a common aggregate of cells or modules.

Besides, there is provided an application of an electric power storing secondary battery, wherein discharged power is supplied to loads at multiple electric power consumers via a single ac/dc converter that is provided for secondary battery, and the discharged power fee to each electric power consumer is calculated. Besides, there is provided an application of an electric power storing secondary battery, wherein demand transaction to users of the electric power storing secondary battery is processed based on the calculated price for using the electric power storing secondary battery.

If this calculation is done by the electric power consumer 6, it is a payment report that is to be prepared.

In FIG. 1, there is employed an application wherein the manufacturer/lender 4 of the electric power storing secondary battery 10, who is the owner of the electric power storing secondary battery 10 under the contract, lends 7 the electric power storing secondary battery 10 or a power storage system comprising of the electric power storing secondary battery 10 and ac/dc converters 11 & 12 to the electric power consumer 6, and the electric power storing secondary battery is installed and operated near at hand the electric power consumer 6. In this application, the electric power consumer 6, who purchases nighttime electric power from the electric power supplier 5 and uses the stored nighttime electric power in the daytime, can gain a profit from the difference between the nighttime and daytime power fees. By paying part of the profit as the rental fee to the above manufacturer/lender 4, owner of the electric power storing secondary battery 10, the power user can utilize the electric power storing secondary battery 10 without making initial investment. Consequently, as the electric power storing secondary battery 10 will be utilized more and more widely, effective use of nighttime electric power is expanded and the difference between the daytime and nighttime power demands decrease, that is to say, there is produced an advantage that the utilization factor of the generating facility and transmission/transformation equipment improves.

In this application, it is preferred that the electric power storing secondary battery 10 is operated, maintained and managed by the manufacturer/lender 4 itself, who is the owner, or by a subcontractor (not shown) of the manufacturer/lender 4 or the electric power consumer 6. In this way, the electric power storing secondary battery 10 can be operated, maintained and managed by such operators that are well aware of the operating procedure or qualified for the operation. The manufacturer/lender 4 is the most competent for the operation, maintenance and management of the electric power storing secondary battery because it is well aware of the construction, characteristic and operating procedure. In addition, since the operation, maintenance and management of multiple power storage secondary batteries 10 installed at multiple electric power consumers 6 & 6' can be taken charge by operators with sufficient knowledge on the electric power storing secondary battery or with qualification, there is produced an advantage that the number of operators needed for the operation, maintenance and management can be reduced and the operation, maintenance and management services can be simplified as compared to a case where each electric power consumer 6 takes charge of the operation, maintenance and management of each electric power storing secondary battery. The operation of the electric power storing secondary battery 10 can be automated and, if automated, the manufacturer/lender, who is the owner of the electric power storing secondary battery, or a subcontractor of the owner or electric power consumer can monitor the operating condition from a remote point and take necessary remedial action in case of failure.

In particular, where the electric power storing secondary battery 10 is sodium-sulfur battery, it is necessary that a qualified hazardous material operator take charge of the operation because of the regulation of the Fire Fighting Law. Even in this case, a hazardous material operator can be assigned easily and proper operation and management in conformance to the law is available if the operation, maintenance and management are taken charge by the owner or subcontracted with a qualified hazardous material operator. In the meantime, sodium-sulfur battery is a very excellent battery as an electric power storing secondary battery since it has advantages that the battery is compact in size and high in energy density, charging and discharging efficiency is excellent, and that the battery is suitable for mass-production because various component materials are available. Because it requires less installation space, it can be installed inside a building or an apartment house, that is, it is suitable for such installation near at hand the electric power consumers that is the most effective way for load leveling.

It is also allowable that a third party, not shown though, purchases the electric power storing secondary battery 10 from the manufacturer/lender 4 and becomes an owner and then the owner lends the power storage secondary battery to the electric power consumer 6. This also leads to an advantage that the operation, maintenance and management of the electric power storing secondary battery can be simplified because of the same reason as above that the operation, maintenance and management can be taken charge by personnel with necessary qualifications and skill and that multiple power storage secondary batteries can be operated, maintained and managed by the same personnel. In addition, it is also allowable that a third party such as a building maintenance firm or elevator maintenance firm runs a rental business of electric power storing secondary battery jointly with the manufacture/lender of the electric power storing secondary battery or that the manufacture/lender of the electric power storing secondary battery lends the electric power storing secondary battery to a third party and then the third party lends the electric power storing secondary battery to the electric power consumer.

According to an embodiment shown in FIG. 1, an electric power storing secondary battery is lent to multiple electric power consumers and the multiple electric power consumers 6 & 6' utilize the electric power storing secondary battery 10 commonly. In this figure, each electric power consumer, utilizing separate ac/dc converters 11 & 12 that are connected to the same electric power storing secondary battery 10, purchases nighttime electric power from the electric power supplier by charging and supplies the power to a load by discharging. An application like this brings great benefit to the electric power consumer 6 as the required number of power storage secondary batteries 10 decreases and consequently the required installation space can be reduced and the rental fee can be reduced. In particular, when the electric power storing secondary battery 10 is installed in a basement of a building or in an apartment house, it is extremely important for expanded utilization that the installation space be reduced. Even in this case, the electric power consumers 6 & 6' need not make an initial investment and yet the utilization of the electric power storing secondary battery 10 is expanded if the owner of the electric power storing secondary battery 10 lends the electric power storing secondary battery 10 or the electric power storing secondary battery 10 and ac/dc converters 11 & 12 to the electric power consumers 6 & 6' and the electric power storing secondary battery 10 and others are installed near at hand the electric power consumers 6 & 6'. In this application, it is also preferred that the operation, maintenance and management are taken charge by the owner or by a subcontractor of the owner or electric power consumer so that the reliability of the electric power storing secondary battery 10 can improve and necessary remedial action can be taken in case of failure. Since multiple electric power consumers 6 & 6' utilize a common electric power storing secondary battery 10 in this application, the number of power storage secondary batteries to be operated, maintained and managed can be less and accordingly the number of operators in charge of the operation, maintenance and management can be less, which in turn results in an advantage that the rental fee can be reduced.

Besides, where multiple electric power consumers 6 & 6' utilize separate ac/dc converters 11 & 12 as shown in FIG. 1, another advantage that the degree of freedom in the operation enhances is brought because the electric power consumers 6 & 6' can utilize the electric power storing secondary battery independently without paying attention to the power consumption condition of each other. On the other hand, where multiple electric power consumers 6 & 6' utilize a common ac/dc converter, not shown though, such advantage is brought that the number of required ac/dc converters can be less and the installation space can be reduced. Although the operation of the electric power storing secondary battery 10 and ac/dc converters 11 & 12 is controlled by the control unit 13 as shown, it is preferred that, if the electric power storing secondary battery 10 is utilized by multiple electric power consumers 6 & 6', the control unit 13 has a function of measuring and storing data of the electric power quantity purchased and consumed by each electric power consumer and calculating the amount of the electric power fee to be paid to the electric power supplier and the rental fee for the electric power storing secondary battery 10 to be paid to the owner of the electric power storing secondary battery. It is also allowable that the electric power quantity supplied from the electric power supplier is measured collectively and the amount of the electric power fee to be paid is calculated based on the power consumption data.

FIG. 2 shows an example of the operating state at two electric power consumers in an embodiment where multiple electric power consumers 6 & 6' utilize a common electric power storing secondary battery 10. The vertical axis represents the electric power quantity to an arbitrary scale and the horizontal axis represents the time. Case a) shows the operating state at the first electric power consumer, b) shows the operating state at the second electric power consumer, and c) is the sum of the two, wherein electric power is discharged in the daytime and charged in the nighttime. In the example shown, the same power consumption, i.e. quantity of discharged power and the same peak power in the discharge operation are exhibited in both cases a) and b) but the peak positions of the discharged power are different. It is very common that the peak position of the discharged power differs if the purpose or application of power consumption at each electric power consumer differs. As a result, in Case c) showing the sum of the two, the quantity of discharged power is the sum of that in a) and b) but the peak discharged power is smaller than the sum of the two peaks. While the quantity of charged power of the electric power storing secondary battery 10 depends upon the quantity of discharged power, charging and discharging efficiency of the battery, and efficiency of the ac/dc converter, and the minimum battery capacity is determined by it, increase of the peak discharged power or peak charged power will cause increase in the heat radiation from the battery or decrease in the efficiency of the battery. For this reason, even if the same electric power quantity is needed, greater battery capacity is generally needed as the peak increases. That is, where each of the multiple electric power consumers utilizes individual electric power storing secondary battery, the required capacity of each electric power storing secondary battery is determined by the power consumption and the peak power of each electric power consumer. On the other hand, where multiple electric power consumers 6 & 6' utilize a single electric power storing secondary battery 10 as shown in FIG. 1, the required battery capacity can be less than the sum of the required capacities in the previous case because the peak power can be lower than the sum of the peak power of each electric power consumer. Consequently, the capacity and size of the electric power storing secondary battery 10 becomes smaller than in a case where each electric power consumer utilizes individual electric power storing secondary battery, which results in an advantage that the installation space and cost can be reduced.

As explained above, where a single electric power storing secondary battery is utilized by multiple electric power consumers, each electric power consumer's use price share of the electric power storing secondary battery and/or ac/dc converter can be calculated in a similar manner as in S4 and S6 in FIG. 3 based on each electric power consumer's quantity of discharged power, on the discharged power fee calculated from the quantity of discharged power and unit price of electric power, or on the discharged power fee and the difference between the minimum power fees before and after the employment of the electric power storing secondary battery. In calculating the use price share, a special discount rate or fuel surcharge specified by the electric power supplier can be included.

As a result of the above, it becomes possible that the total price for using all power storage secondary batteries and/or ac/dc converters is specified in the contents of the contract (S5) and each electric power consumer's use price is calculated from the total use price, or that the total price for using the electric power storing secondary battery and/or ac/dc converter is calculated based on the difference of electric power fee calculated from the total quantity of charged power and total quantity of discharged power of the electric power storing secondary battery or on the difference of electric power fee and the total difference between the minimum power fees before and after the employment of the electric power storing secondary battery and each electric power consumer's use price is calculated from the total use price.

Besides, it is also possible in calculating the total use price that the electric power fee is calculated including a special discount rate or fuel surcharge specified by the electric power supplier or a special power fee agreed in the contract with the electric power supplier is applied. Each electric power consumer's use price is calculated as the product of the use price share and the total use price.

A similar effect holds true with the ac/dc converters 11 & 12 and, if each electric power consumer utilizes individual ac/dc converter, the capacity of the ac/dc converter is determined by the peak power of each electric power consumer. On the other hand, where multiple electric power consumers 6 & 6' utilize a single ac/dc converter, not shown through, the capacity of the ac/dc converter can be smaller than the sum of the ac/dc converter capacities required in a case where each electric power consumer utilizes individual ac/dc converter, because the peak power can be lower than the sum of each electric power consumer's peak power. This leads to an advantage that the ac/dc converter can be made smaller in size, simpler in structure, and lower in cost and that the installation space can be reduced. For information sake, in case of an electric power storing secondary battery used for load leveling, it is common that the capacity of an ac/dc converter depends on the peak discharged power because the peak discharged power is generally higher than the peak charged power. Besides, since the quantity of charged power of an electric power storing secondary battery is greater than the quantity of discharged power due to the effect of the charging and discharging efficiency, the required battery capacity is generally determined by the quantity of charged power and the peak discharged power. Besides, in a particular case, it is possible that the quantity of charged power is set higher than what is normally required to meet the quantity of discharged power so as to store excess electric power and use it as an emergency power supply or uninterrupted power supply when needed. If a sodium-sulfur battery is float-charged at high charging voltage as generally applied to a lead battery or the like, the battery resistance increases and consequently instantaneous discharge of big electric power for emergency use cannot be operated. In order to use the battery commonly for load leveling and for emergency power supply or uninterrupted power supply, it is preferred that the voltage at charging end is set to an appropriate level ranging from 2.1 to 2.5 V per battery in series so as to prevent resistance increase of the ac/dc converter must be determined taking into account the peak power in emergency use.

An embodiment shown in FIG. 1 is put into practice, where a sodium-sulfur battery of 1000 kWh is employed as the electric power storing secondary battery, a power storage system comprise two ac/dc converters of 100 kW and a control unit, the system is lent from the battery manufacture to two electric power consumers, and each is installed in a basement of a building where the electric power consumer's load, that is, power consuming apparatus is located. In addition that the battery is operated automatically by the control unit, a device for remote monitoring for abnormality during the operation is installed and the battery manufacturer manages the system from a remote point. Besides, the battery manufacturer also patrols periodically to check the operating condition of the battery. According to this application, the electric power consumers can charge electric power in the nighttime and use it in the daytime, and pays part of the difference between the daytime and nighttime power fees as the rental fee to the battery manufacturer, enjoying an advantage of utilizing the electric power storing secondary battery without making an initial investment. For the electric power supplier, on the other hand, this application consequently promotes effective utilization of nighttime electric power, which in turn results in an advantage that the utilization factor of the generating facility and transmission/transformation equipment can be improved by load leveling. In this construction, since separate ac/dc converter is provided for each electric power consumer, the electric power consumers can use electric power up to a peak of 100 kW independently without paying attention to the power consumption condition of each other. Since the system efficiency in discharging is 90%, the quantity of discharged power up to 900 kWh can be used, that is, operation at an average power of 100 kW in the total of the two electric power consumers is available for nine hours.

According to the present invention, initial investment in the electric power storing secondary battery by an electric power consumer is none or less, reliability of the battery can be improved and proper remedial action can be taken in case of failure because the operation, maintenance and management of the battery are taken charge by personnel with sufficient knowledge and necessary qualification, and as a result, utilization of the electric power storing secondary battery is expanded and consequently the utilization factor of a generating facility and transmission/transformation equipment is enhanced by load leveling. Besides, according to the present invention, installation space of the electric power storing secondary battery can be reduced and required capacity of the battery can be reduced.

What is claimed is:

1. An electric power system using an electric power storing secondary battery, in which electric power is stored in the nighttime and used in the daytime via an ac/dc converter; said system comprising: an electric power meter which measures the charged power that is charged from a generating facility into the electric power storing secondary battery via the ac/dc converter, and also measures the discharged power that is supplied from the electric power storing secondary battery to a load via the ac/dc converter; and a processing unit which calculates a difference of electric power fee from the quantity of charged power and quantity of discharged power measured by the electric power meter and respective unit prices of electric power, and then calculates the price for using the electric power storing secondary battery based on the difference of the electric power fee or on the difference of the electric power fee and the difference between the minimum power fees before and after the employment of the electric power storing secondary battery.

2. An electric power system using an electric power storing secondary battery, in which electric power is stored in the nighttime and used in the daytime via an ac/dc converter; said system comprising: an electric power meter which measures the charged power that is charged from a generating facility into the electric power storing secondary battery via the ac/dc converter, and also measures the discharged power that is supplied from the electric power storing secondary battery to a load via the ac/dc converter; and a processing unit which calculates the price for using the electric power storing secondary battery based on the balance calculated from the quantity of charged power and quantity of discharged power measured by the electric power meter and respective unit prices of electric power or based on the balance, and the difference between the minimum power fees before and after the employment of the electric power storing battery.

3. An application of an electric power storing secondary battery in an electric power system, in which electric power is stored in the nighttime and used in the daytime via an ac/dc converter; wherein: the charged power that is charged from a generating facility into the electric power storing secondary battery via the ac/dc converter is measured; the discharged power that is supplied from the electric power storing secondary battery to a load is measured; a difference of electric power fee is calculated from the measured quantity of charged power and quantity of discharged power and respective unit prices of electric power; and the price for using the electric power storing secondary battery is calculated based on the difference of the electric power fee or on the difference of the electric power fee and the difference between the minimum power fees before and after the employment of the electric power storing secondary battery.

4. An application of an electric power storing secondary battery according to claim 3, wherein the discharged power is supplied to a plurality of loads through a plurality of ac/dc converters provided for the electric power storing second battery and the respective discharged power fees to the loads are calculated.

5. An application of an electric power storing secondary battery according to claim 3, wherein the discharged power is supplied to loads at a plurality of electric power consumers through a plurality of ac/dc converters provided for the electric power storing secondary battery and the respective discharged power fees to the electric power consumers are calculated.

6. An application of an electric power storing secondary battery in an electric power system, in which electric power is stored in the nighttime and used in the daytime via an ac/dc converter; wherein: the charged power that is charged from a generating facility into the electric power storing secondary battery via the ac/dc converter is measured; the discharged power that is supplied from the electric power storing secondary battery to a load is measured; and the price for using the electric power storing secondary battery is calculated based on the balance calculated from the measured quantity of charged power and quantity of discharged power and respective unit prices of electric power or based on the balance, and the difference between the minimum power fees before and after the employment of the electric power storing secondary battery.

7. An application of an electric power storing secondary battery according to claim 3; wherein the price for using the electric power storing secondary battery is calculated including the price for using the ac/dc converter.

8. An application of an electric power storing secondary battery according to claim 3; wherein
discharged power is supplied from a single electric power storing secondary battery to multiple loads, and the discharged power fee to each load is calculated.

9. An application of an electric power storing secondary battery according to claim 3; wherein
discharged power is supplied to multiple loads via a single ac/dc converter that is provided for the electric power storing secondary battery, and the discharged power fee to each load is calculated.

10. An application of an electric power storing secondary battery according to claim 3; wherein
multiple ac/dc converters that are provided for a single electric power storing secondary battery are controlled by a single control unit, and the quantity of discharged power via each ac/dc converter is measured by a single electric power meter.

11. An application of an electric power storing secondary battery according to claim 3; wherein
discharged power is supplied from a single electric power storing secondary battery to loads at multiple electric power consumers, and the discharge power fee to each electric power consumer is calculated.

12. An application of an electric power storing secondary battery according to claim 3; wherein
discharged power is supplied to loads at multiple electric power consumers via a single ac/dc converter that is provided for the electric power storing secondary battery, and the discharged power fee to each electric power consumer is calculated.

13. An application of an electric power storing secondary battery in an electric power system, in which electric power is stored in the nighttime and used in the daytime via an ac/dc converter; wherein discharged power is supplied to loads at multiple electric power consumers via an ac/dc converter that is provided for a single electric power storing secondary battery.

14. An application of an electric power storing secondary battery according to claim 13; wherein a single ac/dc converter is provided for the electric power storing secondary battery.

15. An application of an electric power storing secondary battery according to claim 13; wherein multiple ac/dc converters are provided for the electric power storing secondary battery.

16. An application of an electric power storing secondary battery in an electric power system, in which electric power is stored in the nighttime and used in the daytime via an ac/dc converter; wherein discharged power is supplied to loads at multiple electric power consumers via an ac/dc converter that is provided for a single electric power storing secondary battery; and
wherein the discharged power that is supplied to loads at the multiple electric power consumers is measured, and then each electric power consumer's use price share of the electric power storing secondary battery and/or ac/dc converter is calculated based on the quantity of discharged power to each electric power consumer, or based on the discharged power fee calculated from the quantity of discharged power and unit price of electric power, or based on the discharged power fee and the difference between the minimum power fees before and after the employment of the electric power storing secondary battery.

17. An application of an electric power storing secondary battery according to claim 3; wherein demand transaction to users of the electric power storing secondary battery is processed based on the calculated price for using the electric power storing secondary battery.

* * * * *